(12) United States Patent
Vigna et al.

(10) Patent No.: US 9,921,405 B2
(45) Date of Patent: Mar. 20, 2018

(54) ELECTROSTATICALLY ACTUATED OSCILLATING STRUCTURE WITH OSCILLATION STARTING PHASE CONTROL, AND MANUFACTURING AND DRIVING METHOD THEREOF

(71) Applicants: STMicroelectronics S.r.l., Agrate Brianza (IT); STMicroelectronics International N.V., Amsterdam (NL)

(72) Inventors: Benedetto Vigna, Varese (IT); Marco Ferrera, Concorezzo (IT); Sonia Costantini, Missaglia Lecco (IT); Marco Salina, Cremosano (IT)

(73) Assignees: STMicroelectronics S.r.l., Agrate Brianza (IT); STMicroelectronics International N.V., Schiphol (NL)

( * ) Notice: Subject to any disclaimer, the term of this patent is extended or adjusted under 35 U.S.C. 154(b) by 0 days.

(21) Appl. No.: 15/401,681

(22) Filed: Jan. 9, 2017

(65) Prior Publication Data
US 2017/0123202 A1 May 4, 2017

Related U.S. Application Data

(62) Division of application No. 14/564,237, filed on Dec. 9, 2014, now Pat. No. 9,753,279.

(30) Foreign Application Priority Data

Dec. 12, 2013 (IT) .............................. TO2013A1014

(51) Int. Cl.
*G02B 26/08* (2006.01)
*H04N 9/31* (2006.01)
(Continued)

(52) U.S. Cl.
CPC ........ *G02B 26/0841* (2013.01); *B81B 3/0045* (2013.01); *B81C 1/00198* (2013.01);
(Continued)

(58) Field of Classification Search
CPC  G02B 26/08; G02B 26/0841; G02B 27/1006; H02N 1/006; H02N 1/002;
(Continued)

(56) References Cited

U.S. PATENT DOCUMENTS 6,000,280 A    12/1999  Miller et al.
7,459,093 B1   12/2008  Fu
(Continued)

OTHER PUBLICATIONS

IT Search Report and Written Opinion for IT TO2013A001014 dated Jul. 9, 2014 (8 pages).

*Primary Examiner* — James Phan
(74) *Attorney, Agent, or Firm* — Gardere Wynne Sewell LLP

(57) ABSTRACT

An electrostatically actuated oscillating structure includes a first stator subregion, a second stator subregion, a first rotor subregion and a second rotor subregion. Torsional elastic elements mounted to the first and second rotor subregions define an axis of rotation. A mobile element is coupled to the torsional elastic elements. The stator subregions are electrostatically coupled to respective regions of actuation on the mobile element. The stator subregions exhibit an element of structural asymmetry such that the electrostatic coupling surface between the first stator subregion and the first actuation region differs from the electrostatic coupling surface between the second stator subregion and the second actuation region.

10 Claims, 6 Drawing Sheets

(51) Int. Cl.
    *H02N 1/00*           (2006.01)
    *B81B 3/00*           (2006.01)
    *B81C 1/00*           (2006.01)
    *G02B 27/10*          (2006.01)

(52) U.S. Cl.
    CPC ............. *H02N 1/002* (2013.01); *H02N 1/006* (2013.01); *H04N 9/3129* (2013.01); *H04N 9/3135* (2013.01); *B81B 2201/042* (2013.01); *B81B 2203/0154* (2013.01); *G02B 27/1006* (2013.01); *Y10T 29/49002* (2015.01)

(58) Field of Classification Search
    CPC ................ H04N 9/3129; H04N 9/3135; B81B 2203/0154; B81B 2201/042; B81B 3/0045; B81C 1/00198; Y10T 29/49002
    USPC ............ 359/199.2, 200.6, 224.1–224.2, 900; 310/309
    See application file for complete search history.

(56) References Cited

U.S. PATENT DOCUMENTS

| | | |
|---|---|---|
| 2003/0164042 A1 | 9/2003 | Valentin |
| 2004/0099739 A1 | 5/2004 | Kuo et al. |
| 2011/0109951 A1 | 5/2011 | Goren et al. |
| 2011/0181931 A1 | 7/2011 | Luft et al. |

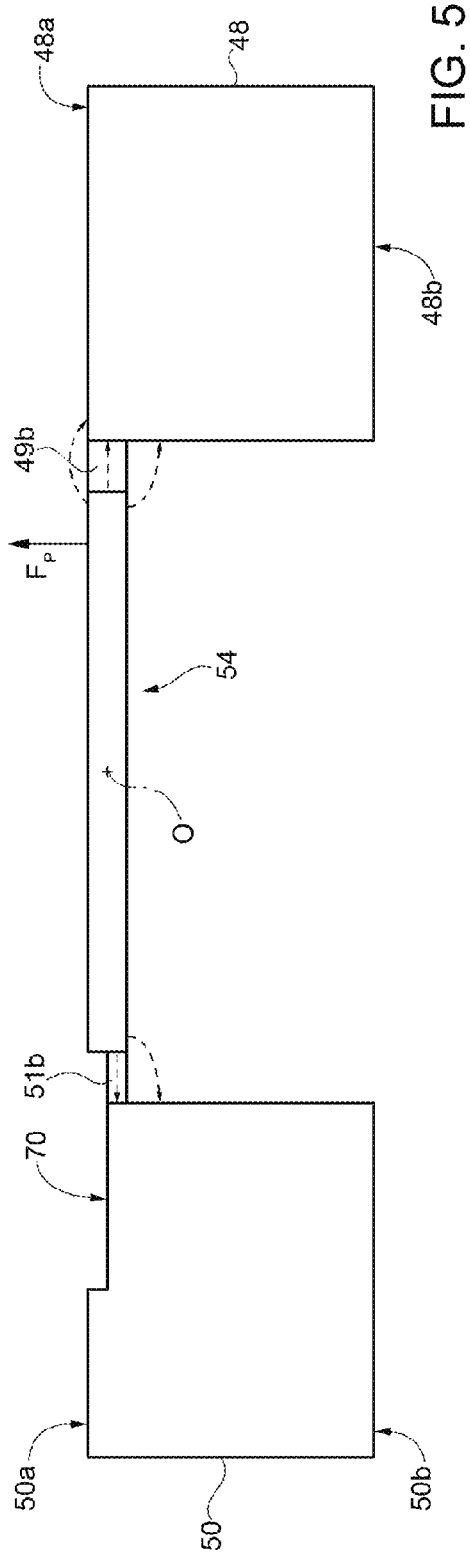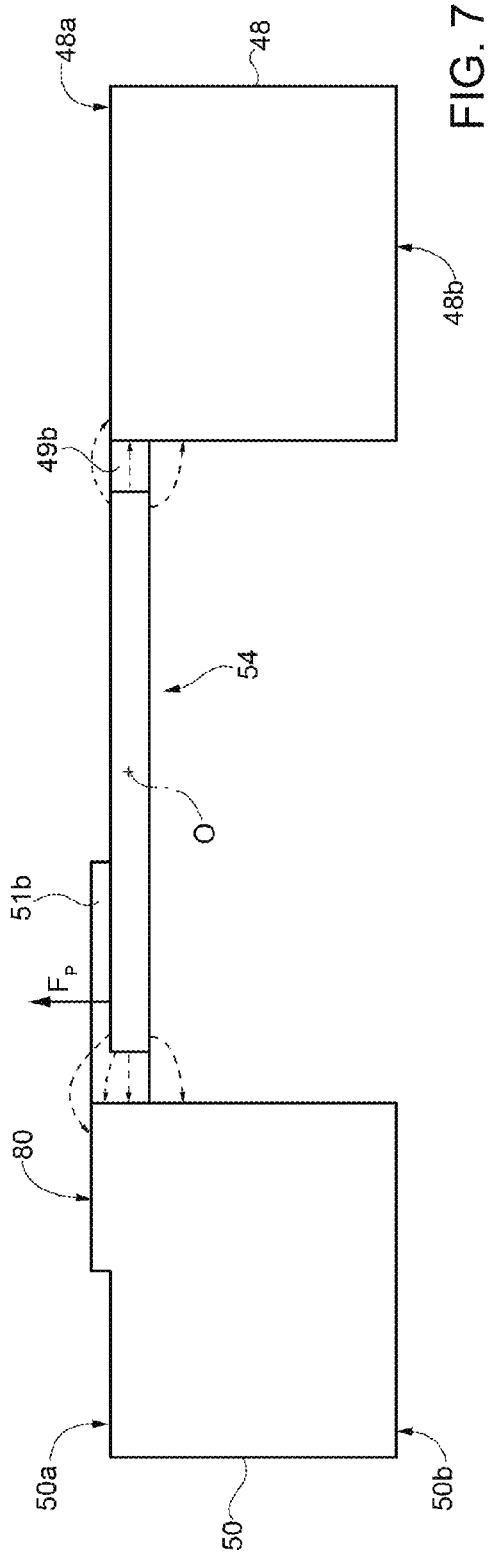

ELECTROSTATICALLY ACTUATED OSCILLATING STRUCTURE WITH OSCILLATION STARTING PHASE CONTROL, AND MANUFACTURING AND DRIVING METHOD THEREOF

CROSS REFERENCE TO RELATED APPLICATIONS

This application is a divisional of U.S. patent application Ser. No. 14/564,237 filed Dec. 9, 2014, now U.S. Pat. No. 9,753,279 which claims priority from Italian Application for Patent No. TO2013A001014 filed Dec. 12, 2013, the disclosures of which are incorporated by reference.

TECHNICAL FIELD

The present invention relates to an electrostatically actuated oscillating structure with control of the oscillation starting phase, and to the corresponding manufacturing method and driving method. In particular, according to the present invention, control of the oscillation starting phase is obtained by structurally shaping the oscillating structure.

BACKGROUND

Known to the art are micromechanical mirror structures (or reflectors) made, at least in part, of semiconductor materials exploiting MEMS (microelectromechanical systems) technology.

MEMS reflectors are designed to receive an optical beam and to vary the direction of propagation thereof, in a periodic or quasi-periodic way. For this purpose, MEMS reflectors include mobile elements formed by mirrors, the positions of which in space are electrically controlled by an appropriate oscillation control signals.

In greater detail, in a generic MEMS reflector comprising a respective mirror, the control of position of the mirror is of particular importance for enabling scanning of a portion of space with an optical beam, which is made to impinge on the mirror. In particular, the control of position of the mirror is crucial in the case of resonant MEMS reflectors, in which, in use, the mirror is made to oscillate in a substantially periodic way about a resting position, the period of oscillation being as close as possible to the resonance frequency of the mirror in order to maximize the angular distance covered by the mirror during each oscillation, and thus maximize the extent of the portion of space scanned.

For example, United States Patent Application Publication No. 2011/0109951 (incorporated by reference) describes a circuit for control of the position of the mirror of a MEMS reflector of a resonant type, said mirror being arranged for rotating, under the action of a motor of an electrostatic type, about an axis of rotation. In particular, the MEMS reflector according to US2011/0109951 comprises a fixed support body, of semiconductor material, and a mirror, which is constrained to the fixed support body by a first spring and a second spring.

The fixed support body comprises a first stator subregion and a second stator subregion, which are connected, respectively, to a first stator electrode and a second stator electrode, and a first rotor subregion and a second rotor subregion, which are connected, respectively, to a first rotor electrode and a second rotor electrode. The first and second stator electrodes enable biasing, respectively, of the first and second stator subregions, whereas the first and second rotor electrodes enable biasing, respectively, of the first and second rotor subregions.

The mirror is mechanically set between the first and second springs, each of which has a respective end that is fixed with respect to the fixed support body. In particular, the first and second springs are fixed, respectively, with respect to the first and second rotor subregions. The mirror and the first and second springs thus form a resonant system, which has a respective mechanical resonance frequency. In general, the mechanical resonance frequency varies in time, for example on account of variations in temperature.

In greater detail, according to the patent application No. US2011/0109951, the voltages of the rotor electrodes and of the stator electrodes, and consequently the voltages of the stator and rotor subregions, are set in such a way as to cause oscillation of the mirror about the axis of rotation. For this purpose, the first and second rotor electrodes are set at a biasing voltage ($V_{pol}$), while the first and second stator electrodes receive a same electrical control signal.

To bring about oscillation of the mirror with a mechanical oscillation frequency that is as close as possible to the mechanical resonance frequency, it is necessary to know the mechanical resonance frequency, and it is necessary to generate the pulses of the electrical control signal with an appropriate frequency and phase, as a function of the position of the mirror.

In greater detail, on the basis of the teachings contained in US2011/0109951, it is possible to control the position of the mirror using an electronic driving circuit. In particular, the stator electrodes are considered as being electrically equivalent to, and coinciding with, a node S, and the first and second rotor electrodes are set at the biasing voltage $V_{pol}$. The mirror is thus electrically equivalent to a capacitor with variable capacitance $C_m$ which has a first terminal, electrically coinciding with the node S, and a second terminal, set at the biasing voltage, which is generated by an amplifier according to the virtual-ground principle. The capacitance of the capacitor with variable capacitance $C_m$ depends upon the torsion to which the first and second springs are subjected, and thus is inversely proportional to the angular distance of the mirror from the resting position, where by "resting position" is meant the position of the mirror to which there corresponds a zero torsion of the first and second springs. During driving, the node S receives electrical voltage pulses. Since the electrical pulses are at a high positive voltage having a value higher than the biasing voltage $V_{pol}$, a torque of an electrostatic nature is exerted on the mirror; in this way, the mirror is kept in oscillation.

However, application of the biasing voltage $V_{pol}$ to the first and second rotor electrodes does not make it possible to drive the mirror in oscillation with a pre-set phase. In practice, the oscillation phase is substantially random or, at least in part, subject to offsets that derive from manufacturing steps that may not be determined beforehand.

The knowledge of the oscillation phase is important since the orientation of the mirror defines, in use, the direction of the images projected. Thus, it is necessary to know the orientation (or phase) of the mirror to generate correct images. According to an embodiment of a known type, described in US 2011/0181931, the motion of the mirror is detected by a microphone configured to transduce into an electrical signal the pressure waves generated by oscillation of the mirror. In this way, according US 2011/0181931, it is possible to recognize in which position the mirror is in use, and, consequently, derive the oscillation phase thereof.

Even though this system and method provide reliable results, they require integration of a MEMS microphone in the same package as the one that houses the mirror, with consequent increase in costs and difficulty in containment of the dimension of the final package.

Further, the oscillation phase is not known immediately, but only after oscillation of the mirror has started, at the end of the starting transient.

There is accordingly a need to provide an electrostatically actuated oscillating structure with control of the absolute oscillation starting phase, and corresponding manufacturing method and driving method, that will overcome at least in part the drawbacks of the known art, and in particular will make it possible to govern start of oscillation of the oscillating structure of the MEMS device with a pre-set and known phase.

SUMMARY

In accordance with an embodiment, an electrostatically actuated oscillating structure and corresponding manufacturing method and driving method are provided.

In an embodiment, an electrostatically actuated oscillating structure comprises: a fixed support body forming a first stator subregion, a second stator subregion, a first rotor subregion and a second rotor subregion; a first torsional elastic element and a second torsional elastic element mechanically coupled, respectively, to the first and second rotor subregions and defining an axis of rotation parallel to a first direction of an orthogonal reference system; and a mobile element arranged between, and connected to, said first and second torsional elastic elements, the mobile element being rotatable about the axis of rotation as a result of a torsion of the first and second torsional elastic elements. The first and second stator subregions are electrostatically coupled to respective first and second regions of actuation of the mobile element, which are diametrically opposite to one another with respect to the axis of rotation. One among the first and second stator subregions includes at least an element of structural asymmetry such that the surface available for said electrostatic coupling between the first stator subregion and the first actuation region is greater than the surface available for the electrostatic coupling between the second stator subregion and the second actuation region.

In an embodiment, a MEMS projective system comprises: an oscillating structure of the type described above and a reflecting element, mechanically coupled to the mobile element, designed to reflect a light beam.

In an embodiment, a method for manufacturing an electrostatically actuated oscillating structure comprises: (a) shaping a fixed support body to form a first stator subregion and a second stator subregion and a first rotor subregion and a second rotor subregion; (b) forming a first torsional elastic element and a second torsional elastic element, constrained, respectively, to the first and second rotor subregions and defining an axis of rotation; (c) forming a mobile element set between, and connected to, said first and second torsional elastic elements, the mobile element being rotatable about the axis of rotation as a result of a torsion of the first and second deformable elements; and (d) forming first and second regions of actuation of the mobile element, which are diametrically opposite to one another with respect to the axis of rotation. The steps (c) and (d) include electrostatically coupling the first and second stator subregions to the first actuation region and to the second actuation region, respectively. Further steps include: (e) forming, in an area corresponding to one between the first and second stator subregions, an element of structural asymmetry such that the surface available for said electrostatic coupling between the first stator subregion and the first actuation region is greater than the surface available for the electrostatic coupling between the second stator subregion and the second actuation region.

BRIEF DESCRIPTION OF THE DRAWINGS

For a better understanding of the present invention, preferred embodiments are now described, purely by way of non-limiting example, with reference to the attached drawings, wherein:

FIG. 5 shows a cross-sectional view of the MEMS reflector of FIG. 2, FIG. 3, or FIG. 4;

FIG. 7 shows a cross-sectional view of the MEMS reflector of FIG. 6.

DETAILED DESCRIPTION OF THE DRAWINGS

According to an aspect, an electrostatically actuated oscillating structure (or a MEMS device including an oscillating mobile element) is provided, which comprises: a fixed support body forming a first stator subregion and a second stator subregion and a first rotor subregion and a second rotor subregion; a first torsional elastic element and a second torsional elastic element (or springs) constrained, respectively, to the first and second rotor subregions and defining an axis of rotation parallel to a direction x of an orthogonal reference system; and a mobile element set between, and connected to, said first and second torsional elastic elements, the mobile element being rotatable about the axis of rotation as a result of a torsion of the first and second deformable elements. The first and second stator subregions are electrostatically coupled to respective first and second regions of actuation of the mobile element (for example, by fingers arranged in comb-fingered fashion). The first and second mobile-element actuation regions are diametrically opposite to one another with respect to the axis of rotation.

According to the present invention, the first and second stator subregions are structurally asymmetrical with respect to one another. For this purpose, one between the first and second stator subregions includes at least one element of structural asymmetry such that the surface available for electrostatic coupling between the first stator subregion and the first actuation region is greater than the surface available for electrostatic coupling between the second stator subregion and the second actuation region.

It is evident that the element of structural asymmetry has at least one dimension greater than any possible process spread or error to which the oscillating structure may be subject on account of the manufacturing process used (depending upon the machinery used, the lithographic/etching processes chosen, etc.).

In particular, the element of structural asymmetry extends in an area of a portion of the first stator subregion or of the second stator subregion directly facing a respective portion of the first or second mobile-element actuation region. In this way, the electrostatic forces that are exerted between the first stator subregion and the first mobile-element actuation region, and between the second stator subregion and the second mobile-element actuation region, are unbalanced with respect to one another. This causes a net force component that may be determined beforehand and is such that the mobile element (given a predefined oscillation control signal) will always start to oscillate in the same direction or, in other words, with the same phase.

Figure 1:
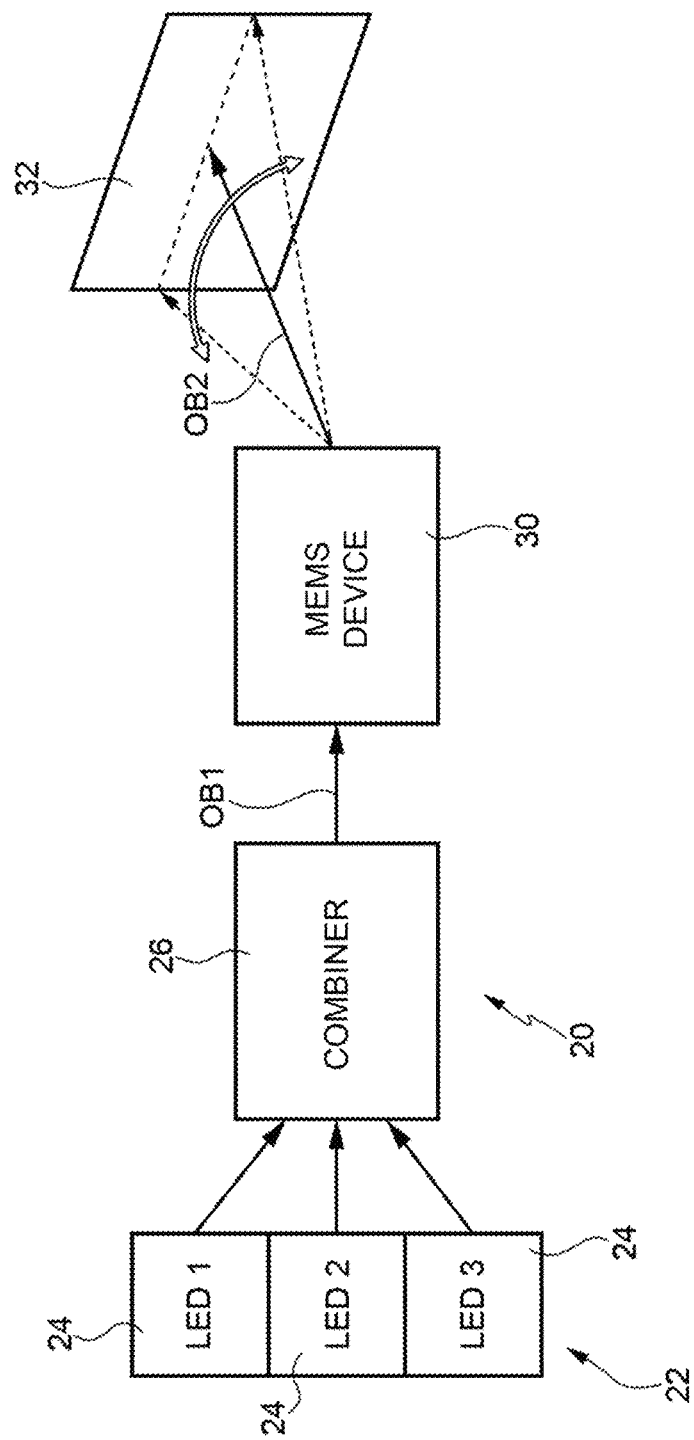
FIG. 1 shows a block diagram of an electronic driving circuit of a MEMS reflector, according to the known art.

FIG. 1 shows a MEMS projective system 20, of a type in a per se known manner, which includes a light source 22 formed, for example, by a plurality of LEDs 24, each of which emits electromagnetic radiation at a corresponding wavelength. For example, FIG. 1 shows three LEDs 24, each of which emits radiation, respectively, around the red (620-750 nm), the green (495-570 nm), and the blue (450-475 nm).

The MEMS projective system 20 further comprises a combiner 26, a MEMS device 30, and a screen 32. The combiner 26 is set downstream of the light source 22 for receiving the electromagnetic radiation emitted by the LEDs 24 and form a single optical beam OB1, obtained by combination of said electromagnetic radiation. The combiner 26 is further designed to orient the optical beam OB1 onto the MEMS device 30. In turn, the MEMS device 30, described in greater detail hereinafter, is designed to generate a reflected optical beam OB2 and to send the reflected optical beam OB2 onto the screen 32 for enabling formation of images on the screen 32.

In detail, the MEMS device 30 is designed to vary in time the orientation in space of the axis of the reflected optical beam OB2 for scanning periodically portions of the screen 32. In particular, the reflected optical beam OB2 linearly scans a portion of the screen 32, possibly the entire screen.

Figure 2:
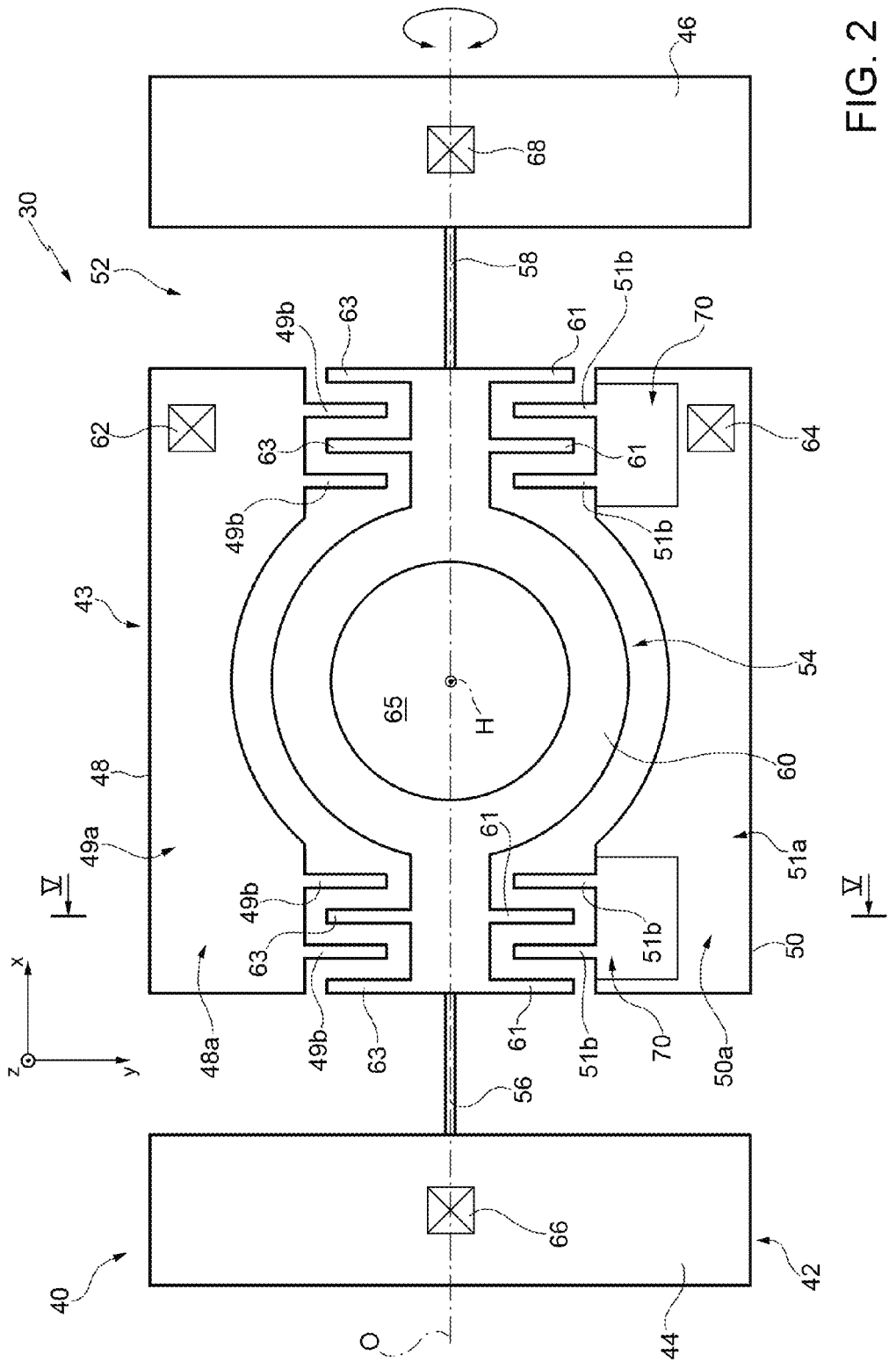
FIG. 2 shows a top plan view of a MEMS reflector according to one embodiment.
Figure 3:
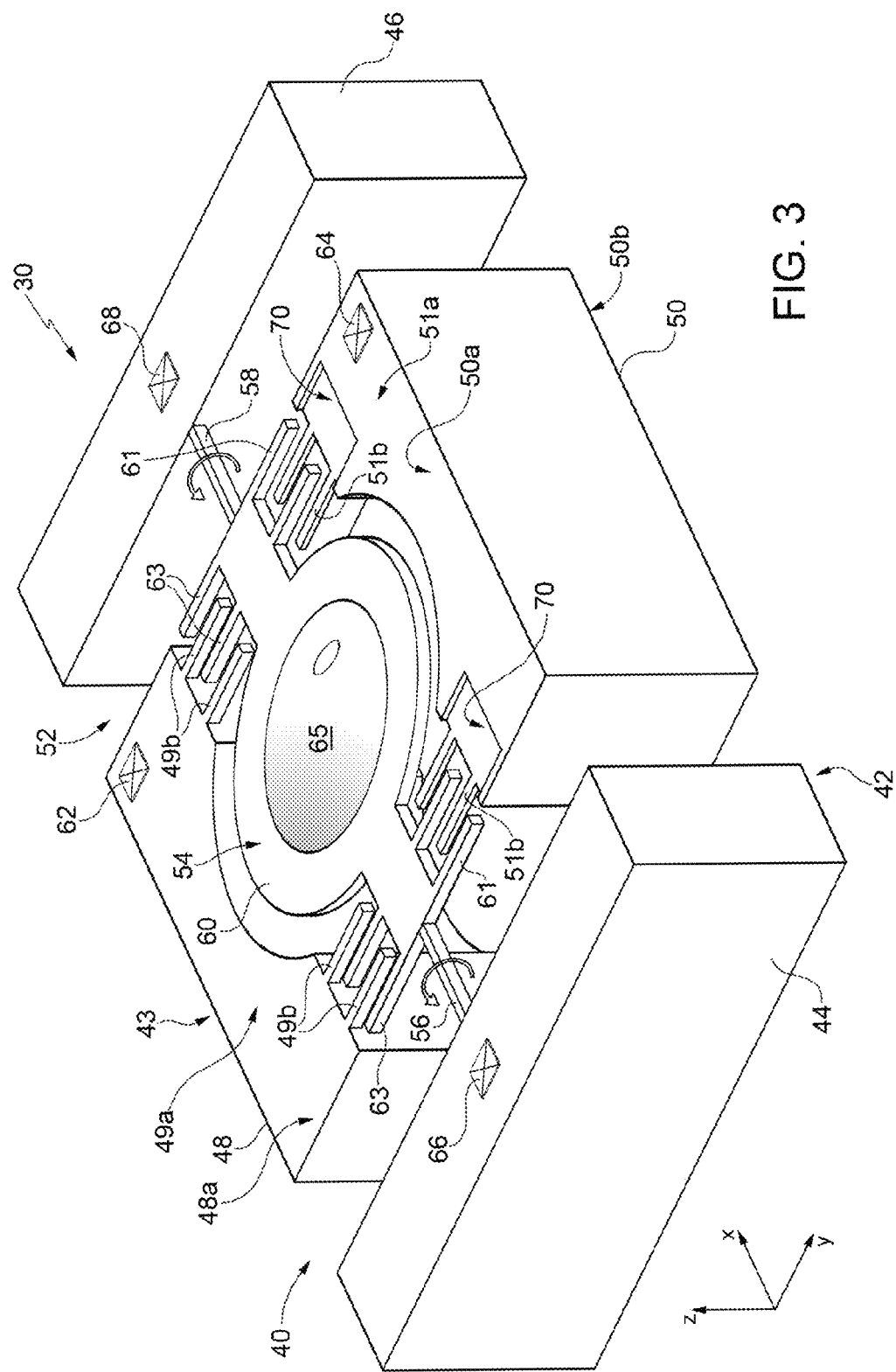
FIG. 3 shows a perspective view of the MEMS reflector of FIG. 2.

FIGS. 2 and 3 show an embodiment of a MEMS device 30 designed for being used in the MEMS projective system 20 of FIG. 1.

As shown in FIGS. 2 and 3, the MEMS device 30 comprises a fixed support body 40, in particular of semiconductor material, which includes a first structural region 42 and a second structural region 43, which are electrically insulated from one another.

The MEMS device 30 is shown in an orthogonal reference system formed by three axes x, y, z. It is further defined an axis H parallel to the axis z of the orthogonal reference system. The first structural region 42 comprises a first rotor subregion and a second rotor subregion 44, 46, which are arranged diametrically opposite with respect to the axis H, and aligned to one another along an axis O parallel to the axis x. Further, the second structural region 43 comprises a first stator subregion 48 and a second stator subregion 50, which are also arranged diametrically opposite with respect to the axis H, and aligned to one another in a direction parallel to the axis y. The first stator subregion 48 is delimited at the top by a front surface 48a and at the bottom by a rear surface 48b. Likewise, the second stator subregion 50 is delimited at the top by a front surface 50a and at the bottom by a rear surface 50b.

In the embodiment shown in FIG. 2, the first stator subregion 48 includes a massive portion 49a and a plurality of elongated elements 49b that protrude (or, in other words, extend in cantilever fashion) from the massive portion 49a and have a main direction of extension along the axis y. In what follows, said elongated elements 49b are referred to as "fingers" 49b.

The second stator subregion 50 includes, in a way similar to the first stator subregion 48, a massive portion 51a and a plurality of respective elongated elements 51b, which protrude (or, in other words, extend in cantilever fashion) from the massive portion 51a and have a main direction of extension along the axis y. In what follows, the elongated elements 51b are referred to as "fingers" 51b. The fingers 49b extend parallel to the axis y starting from respective regions of the massive portion 49a of the first stator subregion 48 in the direction of the second stator subregion 50, and are aligned to one another in a direction parallel to the axis x. Likewise, the fingers 51b extend parallel to the axis y starting from the massive portion 51a of the second stator subregion 50, in the direction of the first stator subregion 48, and are also aligned to one another in a direction parallel to the axis x.

The fixed support body 40 defines a cavity 52. In addition, the MEMS device 30 comprises a mobile body 54 that is constrained to the first and second rotor subregions 44, 46 and is further suspended over the cavity 52.

The mobile body 54 is mechanically and electrically coupled to the first and second rotor subregions 44, 46 by a first deformable element 56 and a second deformable element 58, respectively. The mobile body 54 has a mobile element 60 (that forms a central portion of the mobile body 54), for example circular in top plan view (in the horizontal plane xy), on which a mirror layer 65 is arranged, constituted by a material with a high reflectivity for the light radiation for being projected, such as for example aluminum or gold.

The mobile element 60 is connected between the first and second deformable elements 56, 58. It should be noted that, typically, the mobile element 60, the first and second deformable elements 56, 58 and the first and second rotor subregions 44, 46 form a single piece, i.e., belong to a monolithic structure, in particular of semiconductor material obtained by known micromachining techniques.

In greater detail, a first end of the first deformable element 56 is fixed with respect to the first rotor subregion 44, whereas a first end of the second deformable element 58 is fixed with respect to the second rotor subregion 46. Further, a first end and a second end of the mobile element 60 are fixed with respect to a second end of the first deformable element 56 and to a second end of the second deformable element 58, respectively.

According to one embodiment, in resting conditions, each between the first and second deformable elements 56, 58 has the shape of a parallelepiped, the dimension of which parallel to the axis x is greater than the corresponding dimensions along the axes y and z; for example, the dimension parallel to the axis x is at least five times greater than the dimensions along the axes y and z. In resting conditions, each between the first and second deformable elements 56, 58 has two faces.

For practical purposes, the first and second deformable elements 56, 58 function, respectively, as first spring and second spring, since each of them may undergo a torsion about the axis O, and then return into the position assumed in resting conditions.

During torsion of the first and second deformable elements 56, 58, the two faces thereof that, in resting conditions, are arranged in planes parallel to the plane xy, are moved from the resting position, rotating about the axis O. In fact, the shape of the first and second deformable elements 56, 58 bestows upon them a low torsional stiffness, for example, comprised between $10^{-4}$ and $10^{-3}$ N/rad. The mobile element 60 and the mirror 65 are thus designed to rotate, in use, about the axis O.

In the embodiment shown in FIG. 2, the mobile element 60 defines a respective plurality of elongated elements (fingers) 61, 63, which extend parallel to the axis y and are arranged in such a way that, in resting conditions, they are comb-fingered with the elongated elements (fingers) 49b and, respectively, 51b, carried by the first stator subregion 48 and, respectively, by the second stator subregion 50.

The MEMS device 30 further comprises a first stator electrode 62 and a second stator electrode 64, which are set in contact with the first and second stator subregions 48, 50 and enable electrical biasing of the latter. In addition, the MEMS device 30 comprises a first rotor electrode 66 and a second rotor electrode 68, which are set in contact with the first and second stator subregions 44, 46 respectively, and enable biasing of the latter.

One between the first and second stator subregions 48, 50 is structurally asymmetrical with respect to the other between the first and second stator subregions 48, 50.

In particular, according to the embodiment shown in FIGS. 2 and 3, the second stator subregion 50 presents a reduction of thickness starting from the front surface 50a in an area of the portion of the massive region 51a that extends in the proximity of the fingers 51b, and also in an area corresponding to the fingers 51b themselves. In other words, following the front surface 50a along the axis y towards the fingers 51b, a step is present such that the thickness of the massive region 51a decreases in the area of said step.

In other words, according to this embodiment, the second stator subregion 50 comprises one or more recesses (designated in FIGS. 2 and 3 by the reference number 70) designed to render the first and second stator subregions 48, 50 structurally asymmetrical with respect to one another, in particular when observed in side view along a cross-section obtained by sectioning the MEMS device 30 parallel to the plane yz. A single recess 70 may extend throughout the length of the second stator subregion 50 along the axis x (FIG. 4), or else a plurality of recesses 70 (in particular two recesses) may be formed each in an area corresponding to the portions of the second stator subregion 50 from which the fingers 51b depart, as shown in FIGS. 2 and 3.

Alternatively, it is further possible to form a recess (not shown) only in the area of a portion of the second stator subregion 50 extending (along the axis x) between the portions of the second stator subregion 50 itself from which the fingers 51b depart, but not in the area of the fingers 51b or of the portions of the second stator subregion 50 from which the fingers 51b depart. In this case, said recess may also extend in the second stator subregion 50 for a depth much greater than what has been described with reference to the recess 70.

It is also possible to remove completely along z a portion of the second stator subregion 50 extending (along x) between the fingers 51b.

It is evident that the recess 70 has been previously described, and shown in the figures, as extending in the area of the front surface 50a of the second stator subregion 50 and in the area of the surface of the fingers 51b that extends as a prolongation of the front surface 50a. However, it is evident that the reduction in thickness of the fingers 51b may be obtained also by machining said fingers 51b at a surface thereof diametrically opposite (i.e., opposite along z) to the surface of the fingers 51b, which extends as prolongation of the front surface 50a.

Further, it is evident that the recess 70, here shown as being formed in the area of the second stator subregion 50, may alternatively be formed in the area of the first stator subregion 48, indifferently.

In the case of FIG. 3, each recess 70 is laterally delimited by walls that surround it on three sides. The fourth side, free from walls, extends in an area corresponding to the regions from which the fingers 51b depart. In any case, the reduction of thickness that may be noted at the recess 70 is present also at the fingers 51b.

Figure 4:
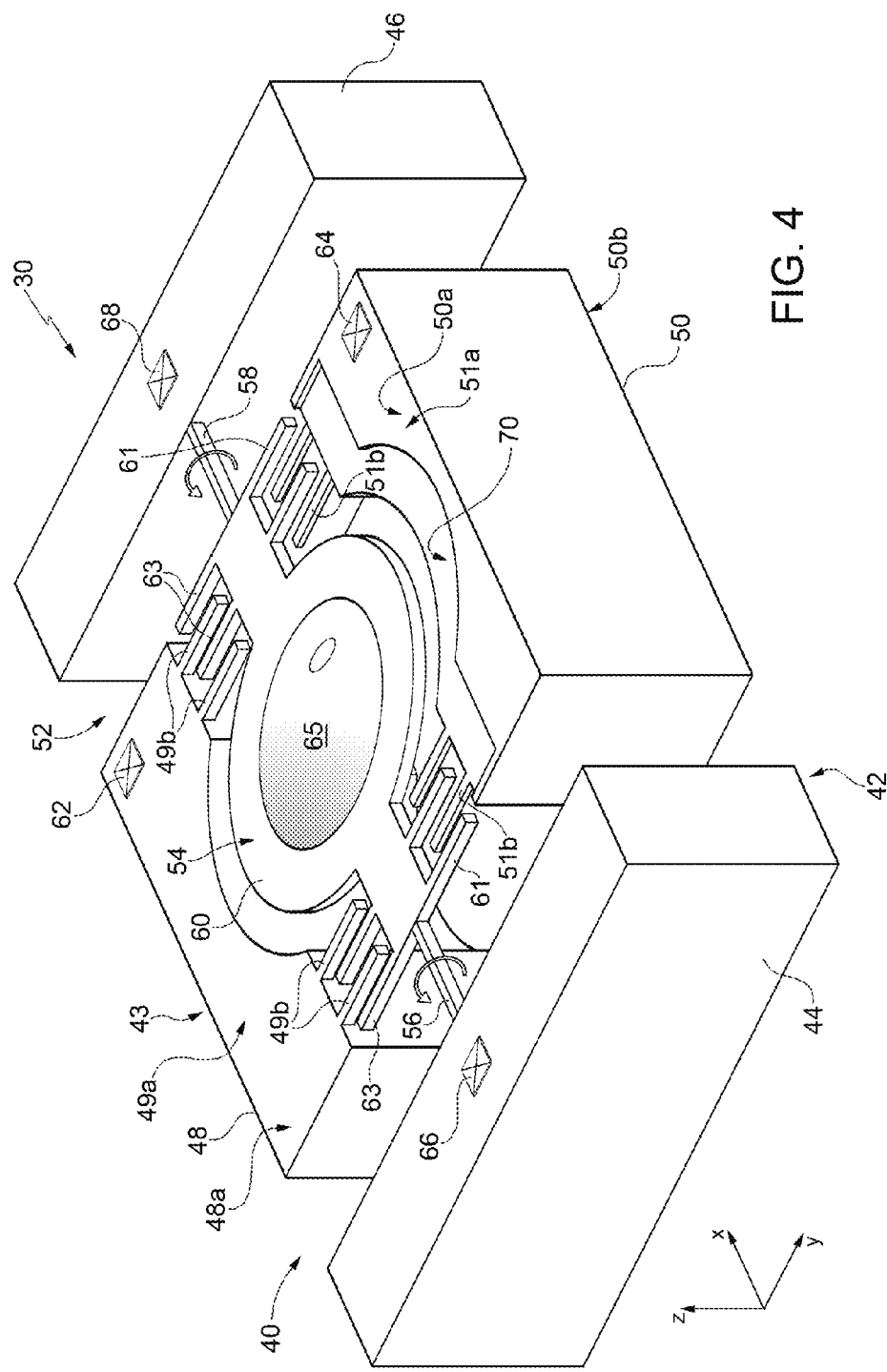
FIG. 4 shows a perspective view of a MEMS reflector according to a further embodiment.

Irrespective of whether the embodiment of FIG. 3 or that of FIG. 4 is considered, the first and second stator subregions 48, 50 have the same thickness when measured in the direction z and, as regards the second stator subregion 50, outside the recess 70. For example, said thickness is comprised approximately between 40 μm and 65 μm. The depth of the recess 70, measured in the direction z starting from the front surface 50a, is chosen of a value such as for being greater than the possible process spreads. For example, the depth of the recess 70 is comprised approximately between 0.8 μm and 2 μm, in particular 1 μm. In other words, generalizing, the depth of the recess 70 is comprised approximately between 1% and 5% of the thickness of the first and second stator subregions 50. As has already been said, said reduction of thickness applies also to the fingers 51b, which have a maximum thickness equal to, or smaller than, the maximum thickness, measured at the recess 70, of the second stator subregion 50.

According to alternative embodiments (not shown), the reduction of thickness (recess 70) extends only in the area of the fingers 51b or else only in the area of the massive portion 51a.

Driving of the MEMS device 30 takes place in a way in a per se known manner. For example, the MEMS device 30 may be driven by excitation of the rotational and out-of-plane modes, by biasing the first and second stator regions 48, 50 at the same voltage (e.g., ground reference voltage) and the first and second rotor regions 44, 46 at a voltage different from the biasing voltage of the first and second stator regions 48, 50 (e.g., a voltage approximately 20 V higher, in modulus, than the ground reference voltage). To optimize the actuation efficiency, the driving frequency is chosen equal to the resonance frequency of the mobile mass.

According to a different driving method, the MEMS device 30 may be driven by excitation of the in-plane mode by biasing the first (or second) stator subregion 48 (50) and the first and second rotor regions 44, 46 at one voltage (e.g., ground reference voltage), and the second (or first) stator subregion 50 (48) at a voltage different from the biasing voltage of the first and second rotor regions 44, 46 (e.g., a voltage approximately 20 V greater, in modulus, than the ground reference voltage).

It has been verified that a MEMS device 30 actuated electrostatically by a comb-fingered structure, in particular of the type shown in FIGS. 2-4, which has a structural asymmetry (in particular in terms of different thickness) between the two stator subregions 48, 50 that govern actuation of the mobile body 54 of the MEMS device 30, shows a net force component that is directed along the axis z and that acts in the region of the fingers 61 directly facing the first stator subregion 48 (i.e., the stator subregion that does not present the recess 70) and comb-fingered to the fingers 49b. Thus, during electrostatic actuation of the mobile body 54, the latter is preferably subjected to a force along z that acts in the region of the fingers 61 facing the first stator subregion 48, such that the mobile body 54 starts to oscillate always with the same phase; see, for example, FIG. 5, which is a graphic illustration of what has been described here. FIG. 5 is a cross-sectional view of the MEMS device 30 taken along the line of section V-V of FIG. 2. The dashed arrows represent the forces of electrostatic coupling (attraction/repulsion) between fingers 61, 63 comb-fingered to the fingers 49b, 51b, whereas the solid arrow represents the force vector $F_p$ that acts on the mobile body 54 in the area of the fingers 61.

This is due to the greater area available for the electrostatic coupling between the mobile body 54 and the first stator subregion 48 as compared to the area available for the electrostatic coupling between the mobile body 54 and the second stator subregion 50. Consequently, the forces of attraction/repulsion (according to the polarity of the driving signals used) between the mobile body 54 and the first stator subregion 48 are higher, in modulus, than the forces of attraction/repulsion between the mobile body 54 and the second stator subregion 50.

It is evident that said effect of control of the oscillation starting phase of the mobile body 54 may be obtained in a way different from what is illustrated in FIGS. 2-4. In particular, according to an embodiment of the present invention shown in FIG. 6, as an alternative to the recesses 70 of FIG. 3, raised portions are formed, or elements of increased thickness, designated by the reference 80, having, in top plan view, the shape and spatial arrangement similar to that of the recesses 70 (i.e., the top plan view corresponds to that of FIG. 2). The raised portions 80 are designed to increase the thickness, along z, of part of the second stator subregion 50 and extend in areas corresponding to portions of the second stator subregion 50 close to the fingers 51b; further, also the fingers 51b have an increased thickness as compared to the fingers 49b. In particular, the fingers 51b have a thickness greater than the fingers 49b by a value equal to the thickness of the raised portion 80 to which they are mechanically coupled; see also FIG. 7, which shows a cross-sectional view of the MEMS device 30 of FIG. 6, obtained by sectioning the MEMS device 30 of FIG. 6 with the cutting plane 82, parallel to yz.

In particular, according to the embodiment shown, the raised portions 80 extend in areas of the second stator subregion 50 that correspond, in top plan view, to the portions of the second stator subregion 50 in which the recesses 70 shown in FIG. 3 extend.

It is evident that the element of increased thickness 80, here represented as being formed in the area of the second stator subregion 50, may alternatively be formed in the area of the first stator subregion 48.

According to a further aspect (not shown) it is possible to envisage formation of a recess 70 in the area of the first stator subregion 48 and simultaneously a raised portion 80 in the area of the second stator subregion 50, or vice versa.

Irrespective of the embodiment, the first and second stator subregions 48, 50 have the same thickness when measured in the direction z and, as regards the second stator subregion 50, outside the raised portion 80. For example, said thickness is comprised approximately between 40 μm and 65 μm. The thickness of the raised portion 80, measured in the direction z starting from the front surface 50a, is chosen of a value such as for being higher than the possible process spreads. For example, the thickness of the raised portion 80 is comprised between 0.8 μm and 2 μm, in particular 1 μm. In other words, generalizing, the thickness of the raised portion 80 is comprised between 1% and 5% of the maximum thickness reached by the first and second stator subregions 50 (obviously, on the outside of the raised portion 80).

Figure 6:
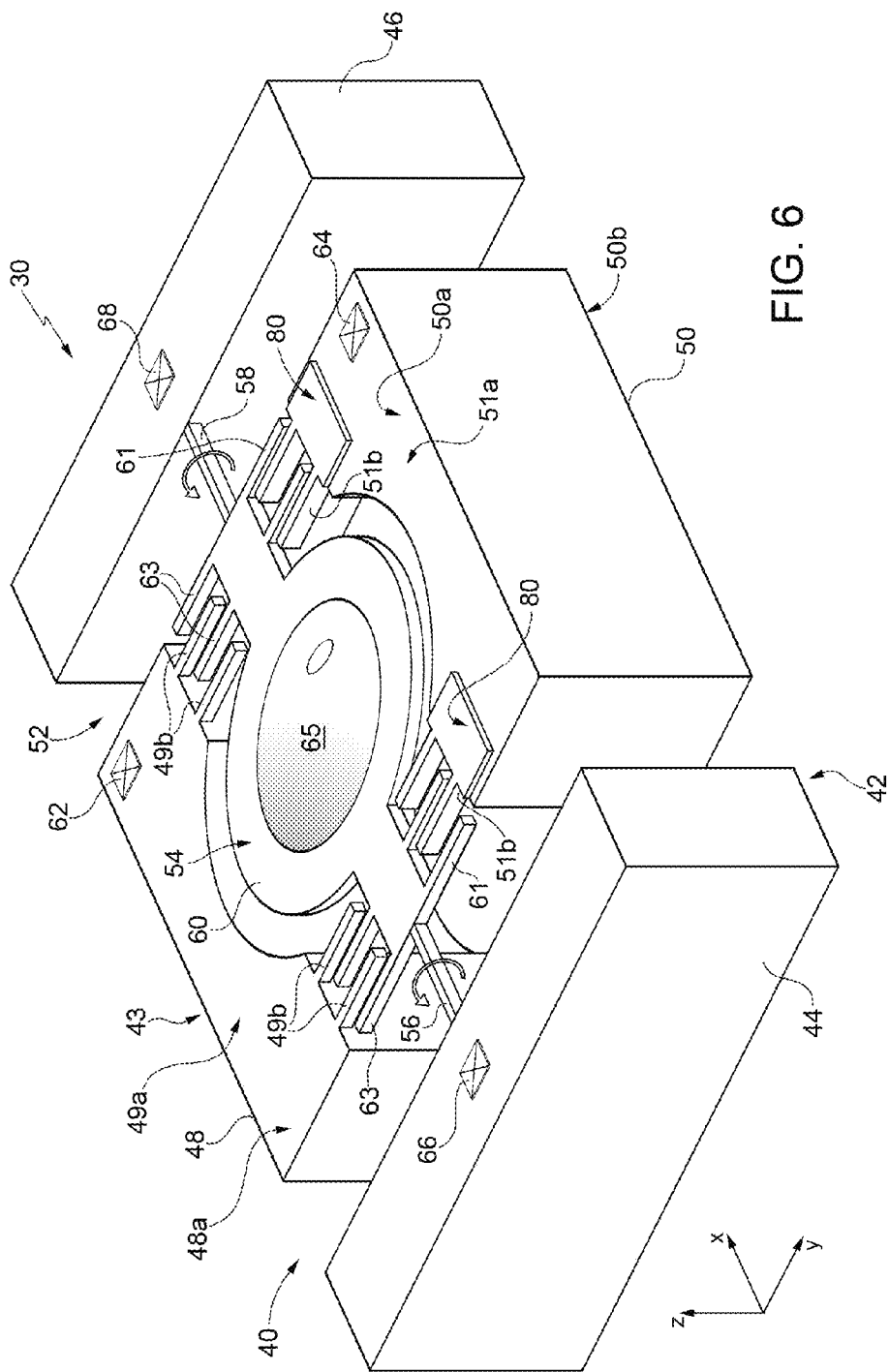
FIG. 6 shows a perspective view of a MEMS reflector according to a further embodiment.

In use, in the case of FIGS. 6 and 7, the second stator subregion 50 and the fingers 51b present a surface for electrostatic coupling with the fingers 61 of the mobile body 53 that is greater as compared to the surface for electrostatic coupling of the first stator subregion 48 and fingers 49b. Consequently, in this case, the component of force $F_p$ directed along the axis z acts in the area of the fingers 61, i.e., of the portion of the mobile body 53 directly facing the second stator subregion 50. Also in this case, as has been described previously, the oscillation starting phase of the mobile body 53 may be determined beforehand.

The MEMS device 30 further comprises an electronic control circuit 70 (not shown), which is designed to start, and then maintain, oscillation of the mobile body 53.

The electronic control circuit 70 is configured to generate, in a per se known manner, a driving signal $V_p$, formed by a pulse train, which is applied to the stator electrodes 62, 64. Each pulse has a positive voltage in the region of, for example, 150-200 V, in such a way that, when a pulse is applied to the first and second stator electrodes 62, 64, the mobile element 60 is at a voltage markedly lower than the voltage of the first and second stator subregions 48, 50, and in particular at least 20 V less, preferably 50 V less. An electrostatic force is thus generated that tends to attract towards one another the plates of the variable capacitor $C_{var}$, i.e., the mobile element and the stator subregions. Further, if we designate by $f_o$ the mechanical oscillation frequency of the mobile element 60, it may be found that the driving signal $V_p$ has an electrical frequency equal to $2 \cdot f_o$.

In detail, the driving signal $V_p$ has a duty cycle of 50% and is supplied to the first and second stator electrodes 62, 64.

Application of each electrical pulse to the first and second stator electrodes 62, 64 causes application of a corresponding torque of an electrostatic nature, which keeps the mobile element 60 in oscillation. In fact, assuming that the mobile element 60 is oscillating and is at an angular distance $+\theta_{max}$, application to the first and second stator electrodes 62, 64 of a first electrical pulse causes generation of a torque that tends to bring the mobile element 60 back into the resting position, with consequent reduction of the torsion to which the first and second deformable elements 56, 58 are subjected. Once the resting position has been reached, application of the torque ceases, but the mobile element 60, on account of own inertia, passes beyond the resting position, until it reaches an angular distance $-\theta_{max}$, at which a second electrical pulse is applied to the first and second stator electrodes 62, 64. A further torque is thus generated, which tends to bring back the mobile element 60 towards the resting position, and so on. The electrical pulses are thus distributed in time in such a way as to maintain the mobile element 60 in oscillation about the axis O.

The electronic control circuit 70 further manages start of oscillation of the mobile element 60. For this purpose, the driving signal generated by the electronic control circuit 70 during the initial start-up stage is a periodic pulsed signal, with an electrical frequency equal to $2 \cdot f_{RIS}'$, where $f_{RIS}'$ is equal to an expected value of the mechanical resonance frequency $f_{RIS}$ of the mobile element 60. Purely by way of example, the value of $f_{RIS}'$ may be determined, in a per se known manner, on the basis of the mechanical characteristics of the MEMS device 30. The electronic control circuit 70 is thus able, starting from a state in which the mobile element 60 is stationary, to start oscillation of the mobile element 60; in particular, the oscillation is started with a mechanical frequency equal to $f_{RIS}'$, which is close to the real value of the mechanical resonance frequency $f_{RIS}$, and with a pre-set known phase.

The advantages that the present MEMS device affords emerge clearly from the foregoing description. In particular, the MEMS device enables detection of the position of the mobile element, and simultaneously driving of the mobile element itself, without having to uncouple the step of detection of the position from the driving step, i.e., from the step of actuation of the electrostatic motor. In this way, the mirror may be driven at an electrical frequency equal to twice the mechanical resonance frequency, in which case it is possible to reduce the voltage of the electrical pulses applied to the stator electrodes, given the same maximum range of the angular distance θ. Consequently, the electronic control circuit may be obtained by using a single technological process. Further, driving of the mirror may be made without any need to resort to a complex processing unit or to AD/DA converters.

Finally, it is clear that modifications and variations may be made to what has been described and illustrated herein, without thereby departing from the scope may of the present invention, as defined in the annexed claims.

In particular, the element of structural asymmetry may consist of, or comprise, a reduction in length along y of the fingers 51*b* with respect to the length along y of the fingers 49*b* (or vice versa).

Further, the embodiments have been described, purely by way of example, with reference to the case of a MEMS device designed to reflect an optical beam in an electronically controllable way, and thus including at least one mirror. Other uses of the MEMS device described hereinafter are, however, possible. In general, the present invention may apply to any oscillating system in which it is important to know the oscillation phase, in particular MEMS resonant systems.

Further, the fingers may be absent. In other words, it is possible for one or more of the mobile element 60 and the first and second stator subregions 48, 50 not to form any elongated element. In this case, the recess 70 (or the element of increased thickness 80) is formed just in the area of the massive portion 51*a* (or 49*a*).

It is further possible for the projective system 20 to include, in addition to the MEMS device 30, an additional MEMS device, set between the MEMS device 30 and the screen 32 and designed to receive the reflected optical beam OB2, to generate a further reflected optical beam, and to send this further reflected optical beam onto the screen 32. In this way, it is possible to scan the screen 32 with said further reflected optical beam, in a first direction and a second direction, for example orthogonal to one another.

It is further possible for the MEMS device 30 to include further a movement device, for example of an electromagnetic type, designed to rotate the mobile element 60, and thus the mirror 65, about a further axis parallel, for example, to the axis y.

Finally, it is possible for at least one between the first and second deformable elements for being of a material different from a semiconductor, such as for example a metal.

What is claimed is:

1. An electrostatically actuated oscillating structure, comprising:
   a fixed support body forming a first stator subregion, a second stator subregion, a first rotor subregion and a second rotor subregion;
   a first torsional elastic element and a second torsional elastic element mechanically coupled, respectively, to the first and second rotor subregions and defining an axis of rotation parallel to a first direction of an orthogonal reference system; and
   a mobile element arranged between, and connected to, said first and second torsional elastic elements, the mobile element being rotatable about the axis of rotation as a result of a torsion of the first and second torsional elastic elements;
   wherein the first and second stator subregions are electrostatically coupled to respective first and second regions of actuation of the mobile element, which are diametrically opposite to one another with respect to the axis of rotation;
   said first and second regions of actuation of the mobile element including a respective plurality of first and second elongated elements, which extend in cantilever fashion towards the first and second stator subregions, respectively;
   said first and second stator subregions including a respective plurality of third and fourth elongated elements comb-fingered to the first and second elongated elements, respectively; and
   at least an element of structural asymmetry comprising a recess extending, at least in part, in the fourth elongated elements for reducing the extension of the fourth elongated elements, in such a way that a surface available for said electrostatic coupling between the third elongated elements and the first elongated elements is greater than a surface available for the electrostatic coupling between the fourth elongated elements and the second elongated elements.

2. The oscillating structure according to claim 1, wherein the reduced extension of said element of structural asymmetry is made in a second direction orthogonal to said first direction and having a value greater than a threshold, said threshold being the maximum value of manufacturing error to which the oscillating structure may be subject during manufacturing thereof.

3. The oscillating structure according to claim 1, wherein the second stator subregion comprises a main body from which said fourth elongated elements extend in cantilever fashion, the recess further extending in the area of a surface region of the main body of the second stator subregion contiguous to the fourth elongated elements.

4. The oscillating structure according to claim 1, further comprising an electronic circuit operatively coupled to the first and second stator subregions and to the mobile element, configured to bias the mobile element at a reference voltage and for biasing the first and second stator subregions by an electrical driving signal including a train of pulses having a voltage value greater, in modulus, than the reference voltage, and such as to generate, and maintain, an oscillation of the mobile element.

5. The oscillating structure according to claim 4, wherein each between said first and second torsional elastic elements has a first dimension, a second dimension, and a third dimension, measured respectively in a first direction, a second direction, and a third direction, orthogonal to one another, said first dimension being greater than said second and third dimensions, said first and second stator subregions being arranged in such a way that, when they receive the electrical driving signal, the mobile element rotates about the axis of rotation parallel to the first direction.

6. The oscillating structure according to claim 1, wherein the fixed support body, the first and second torsional elastic elements, and the mobile element are made of semiconductor material.

7. A method, comprising:
   (a) shaping a fixed support body to form a first stator subregion and a second stator subregion and a first rotor subregion and a second rotor subregion;

(b) forming a first torsional elastic element and a second torsional elastic element, constrained, respectively, to the first and second rotor subregions and defining an axis of rotation;

(c) forming a mobile element set between, and connected to, said first and second torsional elastic elements, the mobile element being rotatable about the axis of rotation as a result of a torsion of the first and second torsional elastic elements; and (d) forming first and second regions of actuation of the mobile element, which are diametrically opposite to one another with respect to the axis of rotation;

wherein steps (c) and (d) include electrostatically coupling the first and second stator subregions to the first actuation region and to the second actuation region, respectively;

wherein step (d) includes forming a respective plurality of first and second elongated elements which extend in cantilever fashion towards the first stator subregion and the second stator subregion, respectively;

wherein step (c) includes forming a respective plurality of third and fourth elongated elements comb-fingered to the first and second elongated elements, respectively;

(e) forming an element of structural asymmetry by forming a recess at least in part in the fourth elongated elements so that a surface available for said electrostatic coupling between the third elongated elements and the first elongated elements is greater than a surface available for the electrostatic coupling between the fourth elongated elements and the second elongated elements.

8. The method according to claim 7, wherein the step of forming the element of structural asymmetry includes forming the element of structural asymmetry having a spatial extension, in a second direction orthogonal to said first direction, of a value greater than a threshold, said threshold being the maximum value of fabrication error to which the oscillating structure is subject during manufacturing thereof.

9. The method according to claim 7, wherein the second stator subregion comprises a main body, said fourth elongated elements being formed so as extend in cantilever fashion from the main body, the step of forming said recess further including forming the recess in a position corresponding to a surface region of the main body of the second stator subregion contiguous to the fourth elongated elements.

10. The method according to claim 7, further comprising:
biasing the mobile element at a reference voltage; and
biasing the first and second stator subregions by an electrical driving signal that includes a train of pulses having a voltage value greater, in modulus, than the reference voltage, for generating, and maintaining, an oscillation of the mobile element.

\* \* \* \* \*